United States Patent
Hishiro

(10) Patent No.: US 6,943,432 B2
(45) Date of Patent: Sep. 13, 2005

(54) SEMICONDUCTOR CONSTRUCTIONS

(75) Inventor: Yoshiki Hishiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/406,755

(22) Filed: Apr. 2, 2003

(65) Prior Publication Data

US 2003/0207587 A1 Nov. 6, 2003

Related U.S. Application Data

(62) Division of application No. 10/092,874, filed on Mar. 5, 2002, now Pat. No. 6,713,404.

(51) Int. Cl.$^7$ .............................................. H01L 21/302
(52) U.S. Cl. ..................... 257/642; 257/639; 257/640; 257/649; 438/82; 438/725; 438/736
(58) Field of Search .............................. 257/639–640, 257/642, 649; 438/82, 725, 736, 780; 430/5, 270.1, 510

(56) References Cited

U.S. PATENT DOCUMENTS

| | | | |
|---|---|---|---|
| 6,030,541 A | * | 2/2000 | Adkisson et al. ............. 216/51 |
| 6,121,133 A | * | 9/2000 | Iyer et al. .................... 438/636 |
| 6,136,511 A | | 10/2000 | Reinberg et al. |
| 6,403,280 B1 | | 6/2002 | Yamahara et al. |
| 6,605,394 B2 | * | 8/2003 | Montgomery et al. ......... 430/5 |
| 2002/0045130 A1 | | 4/2002 | Nitta et al. |
| 2003/0008245 A1 | | 1/2003 | Cheng et al. |

OTHER PUBLICATIONS

Website: "Clinically Amplified Photoresists," http://www.almaden.ibm st projects sub160nm obectives ca. Printed Dec. 31, 2001, 1 page.

Bukofsky, S.J., et al., "*Imaging of Photogenerated Acid in a Chemically Amplified Photoresist*," App. Phys. Letters, vol. 73, No. 3, Jul. 20, 1998, pp. 408–410.

Website: "Clinically Amplified Photoresists." http://www.almaden.ibm/st/projects/subioonm/objectives/ca. Printed Dec. 31, 2001. 1 page.

* cited by examiner

Primary Examiner—Donghee Kang
(74) Attorney, Agent, or Firm—Wells St. John P.S.

(57) ABSTRACT

The invention includes a semiconductor construction comprising a semiconductor substrate, and a first layer comprising silicon and nitrogen over the substrate. A second layer comprising at least 50 weight% carbon is over and physically against the first layer, and a third layer consisting essentially of a photoresist system is over and physically against the second layer. The invention also includes methodology for forming the semiconductor construction.

11 Claims, 2 Drawing Sheets

US 6,943,432 B2

SEMICONDUCTOR CONSTRUCTIONS

RELATED PATENT DATA

This patent resulted from a divisional application of U.S. Pat. application Ser. No. 10/092,874, filed on Mar. 5, 2002, which is issued as U.S. Pat. No. 6,713,404.

TECHNICAL FIELD

The invention pertains to semiconductor constructions and methods of forming semiconductor constructions. In particular aspects, the invention pertains to semiconductor constructions in which an organic material is provided between photoresist and a layer comprising silicon and nitrogen, and to methods of forming such constructions.

BACKGROUND OF THE INVENTION

Photolithography is a commonly-used method for patterning features during semiconductor processing. A photosensitive material (photoresist) is formed over a mass which is ultimately to be patterned, and the photoresist is subsequently subjected to radiation. The radiation is provided in a pattern so that some portions of the photoresist are impacted by the radiation while other portions of the photoresist are not impacted by the radiation. The photoresist is then subjected to developing conditions which selectively remove either the impacted or non-impacted portions. If the photoresist is a positive photoresist, the impacted portions are selectively removed; and if the photoresist is a negative photoresist, the non-impacted portions are selectively removed.

The photoresist remaining after the development defines a patterned mask. The pattern of the mask can subsequently be transferred to the underlying mass utilizing appropriate etching conditions to form patterned features within the mass.

A difficulty which can be encountered during photolithographic processing is that the radiation utilized to pattern the photoresist (typically light) can be reflected from the underlying mass to cause various constructive and destructive interference patterns to occur in the light as it passes through the photoresist. This can adversely affect a pattern ultimately developed in the photoresist.

The problem is typically addressed by providing an antireflective coating immediately beneath the photoresist. Various antireflective coatings have been developed, with a deposited antireflective coating (DARC) being exemplary. Deposited antireflective coatings will typically comprise silicon and nitrogen, and can, for instance, consist of, or consist essentially of, silicon, nitrogen and optionally, hydrogen. DARC's can alternatively comprise silicon, oxygen, and in some cases, hydrogen, and can be referred to as silicon oxynitride materials.

DARC materials can be particularly useful as antireflective coatings during photolithographic processing of metals, and/or insulative materials (with an exemplary insulative material being borophosphosilicate glass).

An exemplary photolithographic fabrication process utilizing a DARC material is described with reference to FIGS. 1 and 2. Referring initially to FIG. 1, a fragment of a semiconductor construction 10 is illustrated at a preliminary processing stage. Construction 10 comprises a substrate 12. Substrate 12 can include, for example, a semiconductive material (such as, for example, monocrystalline silicon). To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A mass 14 is supported by substrate 12. Mass 14 can comprise an insulative material (such as, for example, borophosphosilicate glass) and/or various metals and/or metal compounds. Mass 14 is shown as a single uniform layer, but it is to be understood that mass 14 can comprise stacks of various materials.

An antireflective coating layer 16 is shown formed over mass 14. Layer 16 will preferably comprise a DARC, such as, for example, silicon oxynitride.

A photoresist 18 is shown formed over and physically against antireflective coating 16.

Radiation 20 is shown impacting various regions of photoresist 18. Radiation 20 will typically comprise light, and can, for example, predominately comprise light having a wavelength which is in the region of from about 150 nanometers to about 250 nanometers. Regions of photoresist 18 impacted by radiation 20 are illustrated generally with the label 22, and regions of the photoresist 18 which are not impacted by radiation 20 are illustrated generally with the label 24.

Photoresist 18 can comprise a chemically amplified photoresist. In such application, radiation 20 will create a photogenerated catalyst (typically a strong acid) within regions 22 of the photoresist. The photoresist is then subjected to a post-exposure bake wherein the photogenerated catalyst causes further reactions to alter solubility of exposed regions 22 (and in some applications regions proximate exposed regions 22) relative to regions 24 in a developer solution. An advantage of utilizing chemically amplified photoresists is that such can increase the sensitivity of photoresist to radiation by enabling a single incident photon to be responsible for many chemical events.

Photoresist 18 can be referred to as a photoresist system to indicate that the photoresist can comprise various components ultimately affected by exposure of a portion of photoresist 18 to light. For instance, if material 18 comprises a chemically amplified photoresist system, it will typically comprise a photoactive species which ultimately forms a photocatalyst (typically an acid) upon exposure to light having a suitable wavelength. The photoactive species then interacts with other materials present in the photoresist system to alter chemical properties of the system. The material 18 can be referred to as consisting essentially of a photoresist system to indicate that the material 18 consists essentially of components which are patterned during a photolithographic process to form a mask. Photoresist system 18 can, in particular applications, comprise a multilayer resist.

FIG. 2 illustrates construction 10 after a suitable post-exposure bake, and subsequent exposure to a developing solution. Photoresist 18 is illustrated as being a positive photoresist, and accordingly impacted regions 22 (FIG. 1) are selectively removed relative to non-impacted regions 24.

A problem with utilization of DARC is that such can scavenge photogenerated catalysts (such as acid) during the post-exposure bake of photoresist 18, and can accordingly interfere with the patterning of the photoresist. For instance, the patterned photoresist of FIG. 2 is shown to comprise blocks 30 and 32 and such blocks are wider proximate antireflective coating 16 than at upper surfaces of the blocks. The widened regions at the blocks can be referred to as foot portions 34. Such foot portions are undesired.

It would be desirable to develop photolithographic processing methods which alleviate or prevent formation of foot portions 34.

SUMMARY OF THE INVENTION

In one aspect, the invention includes a semiconductor construction comprising a semiconductor substrate, and a first layer comprising silicon and nitrogen over the substrate. A second layer comprising at least 50 weight % carbon is over and physically against the first layer, and a third layer consisting essentially of a photoresist system is over and physically against the second layer.

In another aspect, the invention encompasses a method of forming a semiconductor construction. A semiconductor substrate is provided, and a first layer comprising silicon and nitrogen is formed over the substrate. A second layer comprising at least 50 weight % carbon is formed over the first layer, and a third layer consisting essentially of a photoresist system is formed over and physically against the second layer. A first portion of the third layer is exposed to radiation while a second portion of the third layer is not exposed to the radiation. The third layer is subjected to conditions which cause either the exposed first portion or unexposed second portion of the photoresist system to release acid. The second layer also releases acid as the third layer is exposed to the conditions. After the third layer is subjected to the conditions, either the first or second portion is selectively removed relative to the other of the first and second portion of the photoresist system.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

In particular aspects, the invention encompasses provision of an organic material (for example, a material comprising at least 50 weight % carbon and/or a material comprising carbon-hydrogen bonds) between a deposited antireflective coating layer (or any layer comprising silicon and nitrogen) and photoresist. An exemplary method illustrating aspects of the invention is described with reference to FIGS. 3 and 4.

Figure 1:
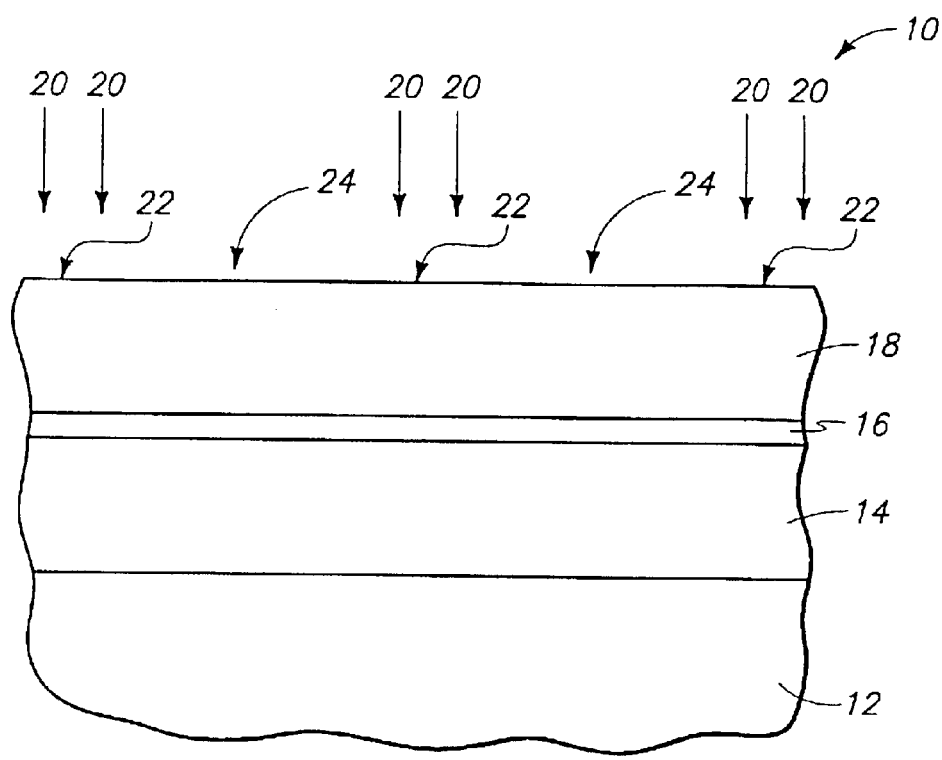
FIG. 1 is a diagrammatic, cross-sectional view of a fragment of a semiconductor construction shown at a preliminary stage of a prior art processing method.
Figure 2:
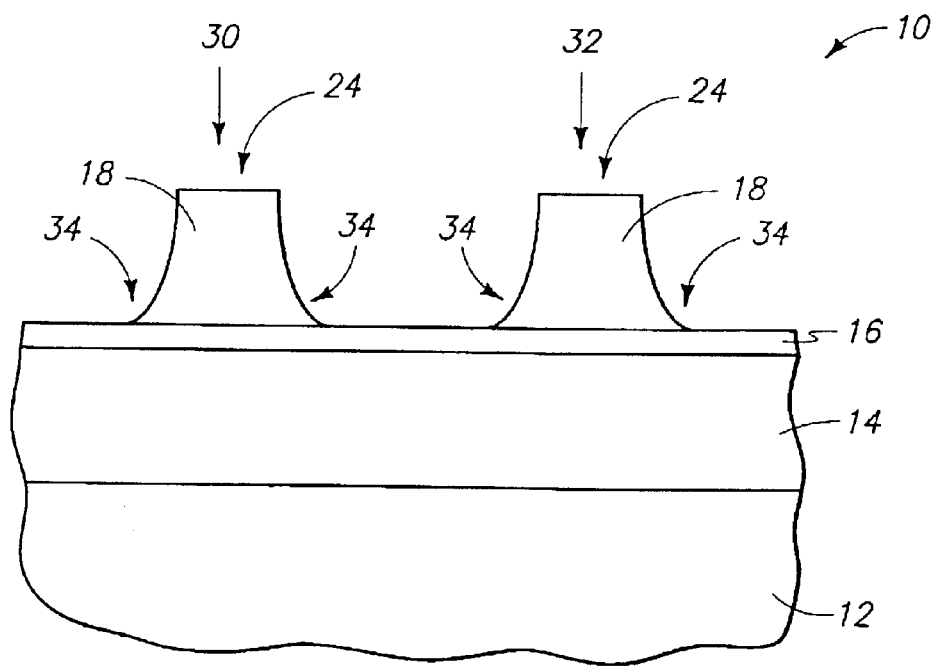
FIG. 2 is a view of the FIG. 1 fragment shown at a prior art processing stage subsequent to that of FIG. 1.
Figure 3:
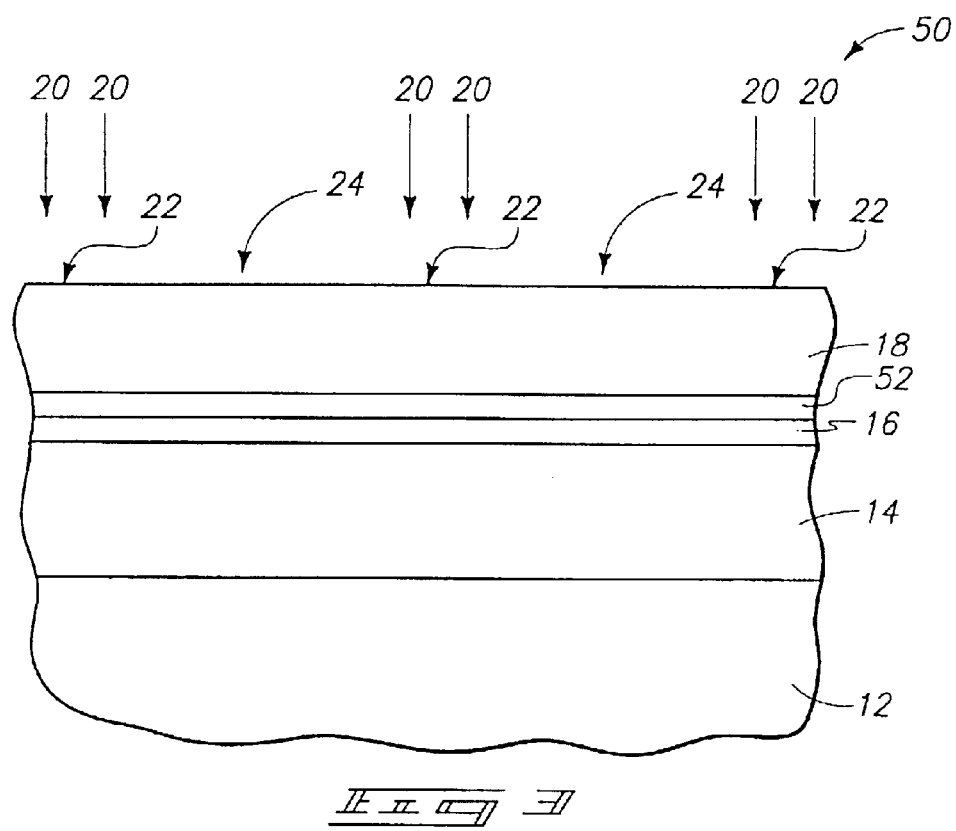
FIG. 3 is a diagrammatic, cross-sectional view of a fragment of a semiconductor construction shown at a preliminary stage of an exemplary method which can be encompassed by the present invention.

Referring initially to FIG. 3, a wafer construction 50 comprises a substrate 12 having a mass 14 thereover. Substrate 12 and mass 14 can comprise identical constructions to those described above with reference to the prior art of FIGS. 1 and 2.

An antireflective coating layer 16 is formed over mass 14. In particular aspects, mass 14 can comprise an insulative material, such as, for example, borophosphosilicate glass, and antireflective coating layer 16 can be physically against such insulative material. In other aspects, mass 14 can comprise a metal, such as, for example, titanium, tantalum, tungsten etc., and antireflective coating 16 can be physically against such metal. In yet further aspects, mass 14 can comprise a metal compound, such as, for example, tungsten nitride, titanium nitride, tantalum nitride, titanium silicide, etc., and antireflective coating layer 16 can be physically against such metal compound. Further, although mass 14 is shown as comprising a single uniform composition, it should be understood that mass 14 can comprise various substructures therein, with exemplary substructures being stacks of various materials.

Antireflective coating layer 16 can comprise, consist essentially of, or consist of silicon, nitrogen and optionally, hydrogen. Alternatively, antireflective coating 16 can comprise, consist essentially of, or consist of silicon, nitrogen, oxygen and optionally, hydrogen. Antireflective coating layer 16 can be referred to as a first layer provided over a semiconductor substrate comprising the illustrated components 12 and 14.

A layer 52 is formed over first layer 16. Layer 52 can be referred to as a second layer formed over the semiconductor substrate comprising components 12 and 14, and in the shown embodiment is formed physically against an upper surface of first layer 16. Second layer 52 is preferably an organic material, and typically comprises at least 50 weight % carbon. Layer 52 can comprise a polymer, such as, for example, an acrylic polymer, and further can comprise chemical cross-links throughout the polymer. Exemplary polymers include homopolymers and copolymers comprising polyhydroxyethylmethacrylate, polymethylmethacrylate, substituted polymethylmethacrylate, and polystyrene.

Layer 52 can be transparent to radiation which is ultimately utilized to pattern a photoresist formed over layer 52, or can comprise components which absorb at least some of the radiation passing through an overlying photoresist and to layer 52. Typically, the radiation utilized for patterning a photoresist will have a wavelength within a region of from about 150 nanometers to 250 nanometers, and accordingly layer 52 can comprise materials which absorb light wavelengths within a region of from 150 nanometers to 250 nanometers. Suitable materials which can be included in layer 52 for absorbing such light are various dyes and chromophores (which can include chromophores incorporated into a suitable polymer). Exemplary chromophores can include, for example, benzene rings, anthracene, naphthalene, and coumarine.

Layer 52 can also comprise one or more materials which generate acid during a bake of photoresist overlying material 52. Suitable acid-generating components are, for example, diazomethane, fluoroalkyl sulfonate, alkyl sulfonate, and onium salts.

Layer 52 can, in particular applications, be spin-coated over layer 16. In such applications, a surfactant can be provided within material 52 to improve a uniformity with which material 52 flows across layer 16. Particularly, the surfactant can improve a uniformity with which material 52 flows into openings (not shown) penetrating into or through layer 16, and can further improve a uniformity with which material 52 flows over projecting features (not shown) extending from an upper surface that material 52 is spin-coated over. Suitable surfactants can include, for example, alkyl sulfonium salts, and perfluoroalkyl sulfonium.

Material 52 can further comprise various solvents. For instance, material 52 can be formed by having various polymeric precursors (which can include crosslinking materials) suspended or dissolved in a suitable solvent, and spin coated over an upper surface of layer 16. The polymeric precursors can then be subjected to suitable conditions to form either a polymeric material from the precursors, or to harden the precursors. The solvents can be removed before, during, and/or after polymerization of the precursors. It can be desired to remove all of the solvents, or, it can be acceptable to leave some of the solvents remaining within layer 52 after polymerization. Suitable solvents can include, for example, ethyl lactate, methylamylketone, polypropyleneglycol monomethyletheracetate (PGMEA), and propyleneglycol monomethylether (PGME), in applications in which the polymeric precursors comprise benzoyl peroxide, benzil and/or benzil derivatives, together with cross-linking materials selected from the group consisting of hexamethoxymethirol melamine and tetramethoxyglycouril. Of course, some precursors may exist in a liquid or other form which can be utilized without solvent, and in such applications the polymeric precursors can be provided neat over a surface of layer 16, and subsequently polymerized.

A layer 18 comprising, consisting of, or consisting essentially of photoresist or a photoresist system is formed over second layer 52. Layer 18 can comprise either positive or negative photoresist, and can be identical to the layer 18 described above with reference to the prior art illustrated in FIGS. 1 and 2. In particular applications, layer 18 comprises a chemically amplified photoresist system.

In the shown embodiment, layer 18 is formed physically against an upper surface of layer 52. Layer 18 can be referred to as a third layer formed over a semiconductor substrate comprising components 12 and 14.

Radiation 20 is shown passing into photoresist 18. Radiation 20 can comprise the radiation discussed above with reference to prior art FIG. 1, and accordingly can comprise light having a wavelength within a range of from about 150 nanometers to about 250 nanometers. The radiation impacts regions 22 of resist 18, while other regions 24 of resist 18 are not exposed to the radiation. Radiation 20 can be referred to as patterned light utilized for photolithography.

In applications in which photoresist 18 comprises a chemically amplified resist, the construction 50 can be subjected to appropriate heating to accomplish a post-exposure bake of construction 50. A suitable temperature of the post-exposure bake is, for example, 90° C. to 150° C., in applications in which photoresist 18 comprises, for example, Sumitomo Chemical Co, Ltd, PAR718™, or JSR Microelectronics AR360™.

During the post-exposure bake, a photogenerated catalyst within regions 22 (typically a strong acid) catalyzes reactions within photoresist 18 to change chemical properties within regions 22 relative to the properties within regions 24. Layer 52 is a barrier between photoresist 18 and antireflective coating 16, and can alleviate or prevent layer 16 from scavenging acid during the post-exposure bake. Further, layer 52 can comprise a suitable component which releases acid, and accordingly enhances acid-catalyzed reactions occurring within photoresist 18 during the post-exposure bake. It is noted that layer 52 can alternatively, or additionally, be configured to release other catalysts besides acid which interact with various components of photoresist 18.

After the post-exposure bake, photoresist 18 is exposed to a suitable developing solvent which selectively removes either the portions exposed to radiation 20 (and/or portions exposed to catalysts generated by the radiation); or the portions of resist 18 which have not been exposed to either radiation or catalysts generated by the radiation. In applications in which resist 18 comprises PAR718™ from Sumitomo Chemical Co, Ltd, of Osaka, Japan, a suitable developing solvent is OPD 4262™ from Arch Chemicals, Inc., of Norwalk Conn., USA.

Figure 4:
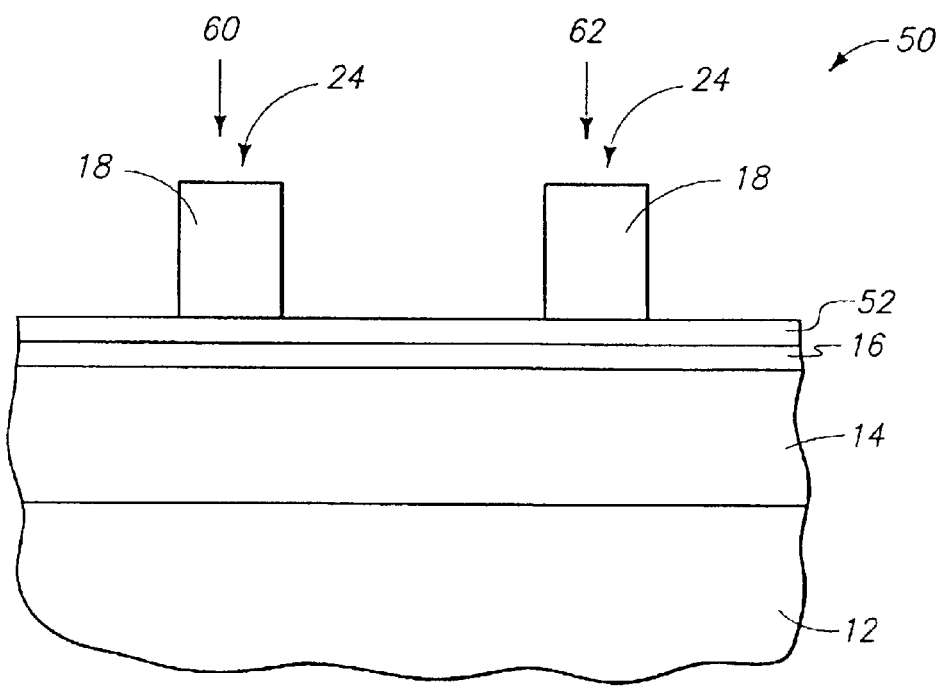
FIG. 4 is a view of the FIG. 3 fragment shown at a processing stage subsequent to that of FIG. 3.

FIG. 4 illustrates construction 50 after exposure to a developing solvent in applications in which resist 18 comprises a positive photoresist. The developing solvent has thus removed portions 22 (FIG. 3) exposed to radiation. In applications in which resist 18 comprises a chemically amplified positive resist system, the solvent can also remove regions of layer 18 proximate to the regions 22 exposed to radiation if such proximate regions are ultimately exposed to catalyst generated from the exposed regions 22.

Resist 18 is shown patterned into blocks 60 and 62, and unlike the prior art construction 10 of FIG. 2, the blocks do not have footer regions (the regions 34 of FIG. 2). Such footer regions are either reduced in size, or, in the shown preferred aspect of the invention, entirely eliminated through utilization of barrier material 52 between antireflective coating 16 and photoresist 18.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:
   a monocrystalline silicon substrate;
   an insulative material layer over the monocrystalline silicon substrate;
   a first layer comprising silicon and nitrogen over and physically against the insulative material layer;
   a second layer comprising at least 50 weight % carbon over and physically against the first layer; and
   a third layer consisting essentially of a photoresist system over and physically against the second layer.

2. The construction of claim 1 wherein the first layer comprises silicon, oxygen and nitrogen.

3. The construction of claim 1 wherein the first layer consists essentially of silicon oxynitride.

4. The construction of claim 1 wherein the second layer comprises carbon-hydrogen bonds.

5. The construction of claim 1 wherein the second layer comprises a surfactant.

6. The construction of claim 1 wherein the second layer comprises a polymer.

7. The construction of claim 1 wherein the second layer comprises a cross-linked polymer.

8. The construction of claim 1 wherein the second layer comprises an acrylic polymer.

9. The construction of claim 1 where in the second layer comprises a component that absorbs light having a wavelength within a region from 150 nanometers to 250 nanometers.

10. The construction of claim 1 wherein the photoresist system comprises a chemically-amplified photoresist.

11. The construction of claim 1 wherein the insulative material of the insulative material layer consists of borophosphosilicate glass.

* * * * *

UNITED STATES PATENT AND TRADEMARK OFFICE
CERTIFICATE OF CORRECTION

PATENT NO. : 6,943,432 B2
APPLICATION NO. : 10/406755
DATED : September 13, 2005
INVENTOR(S) : Yoshiki Hishiro It is certified that error appears in the above-identified patent and that said Letters Patent is hereby corrected as shown below:

Title Page, (56) References Cited, Other Publications lines 1-3, Col. 2 —
  Delete "Website: "Clinically Amplified Photoresists,
  " http://www.almaden.ibm_st_projects_sub160nm_obectives_ca. Printed Dec. 31, 2001, 1 page."

Title Page, (56) References Cited, Other Publications lines 7-9, Col. 2 —
  Replace as follows:
  --Website: "*Chemically Amplified Photoresists*" http://www.almaden.ibm.com/st/projects/sub100nm/objectives/ca/ Printed Dec. 31, 2001, 1 page--

Signed and Sealed this

Eighth Day of August, 2006

JON W. DUDAS
*Director of the United States Patent and Trademark Office*